United States Patent [19]

Clark

[11] 4,328,475

[45] May 4, 1982

[54] TUNING CORE APPARATUS

[75] Inventor: Alfred J. Clark, Palatine, Ill.

[73] Assignee: Motorola Inc., Schaumburg, Ill.

[21] Appl. No.: 155,902

[22] Filed: Jun. 2, 1980

[51] Int. Cl.[3] .......... H03J 5/32

[52] U.S. Cl. .......... 334/7; 334/74; 336/136; 403/329

[58] Field of Search .......... 334/7, 74, 76, 89, 77; 336/136; 403/52, 166, 329

[56] References Cited

U.S. PATENT DOCUMENTS

| | | | |
|---|---|---|---|
| 1,309,060 | 7/1919 | Boye | 403/52 |
| 2,226,822 | 12/1940 | Kirk et al. . | |
| 2,252,092 | 8/1941 | Newman | 334/77 X |
| 2,258,652 | 10/1941 | James . | |
| 2,488,480 | 11/1949 | Spirt | 343/901 X |
| 2,543,551 | 2/1951 | Krug | 336/136 |
| 2,551,294 | 5/1951 | Ross | 403/52 |
| 2,555,511 | 6/1951 | Sands | 334/77 X |
| 2,730,682 | 1/1956 | Wood . | |
| 2,782,385 | 2/1957 | Collett | 334/74 X |
| 2,879,673 | 3/1959 | Passman . | |
| 3,141,147 | 7/1964 | Delp . | |
| 3,177,730 | 4/1965 | Sanger et al. . | |
| 3,271,715 | 9/1966 | Berman et al. . | |
| 3,371,303 | 2/1968 | Fay . | |

*Primary Examiner*—Paul L. Gensler

*Attorney, Agent, or Firm*—James W. Gillman; James S. Pristelski; Phillip H. Melamed

[57] ABSTRACT

An improved tuning apparatus for a receiver of the automotive type which includes a tuning core axially slidable within a tubular coil form having an inductance coil wound therearound in which vibratory movement is minimized. The tuning core is formed with a channel at one end to receive one end of an elongated flexible member. The opposite end of the flexbile member extends away from the axis of the tuning core and abuts against the interior surface of the tubular coil form. In this manner, sliding movement between the tuning core and tubular form and wire is permitted during the tuning operation but a resistance to side-to-side (radial) movement of the core is maintained at other times to minimize the effect of mechanical vibrations thereon which give rise to undesirable microphonics on an associated receiver.

6 Claims, 3 Drawing Figures

TUNING CORE APPARATUS

BACKGROUND OF THE INVENTION

This invention relates in general to a tuning core apparatus and more particularly to such apparatus which, while enabling proper tuning positioning between the core and the coil, effectively minimizes the effect of vibrations on the core and coil during non-tuning periods which may otherwise give rise to undesirable microphonics in an associated radio in which the tuning core apparatus is incorporated.

It is known to tune radio receivers by axially sliding tuning cores or slugs relative to associated coils wound on tubular coil forms and to prevent relative axial movement when tuning adjustment is not desired. Some tuners also attempt to minimize relative radial (lateral) movement between the tuning core and coil. This has been accomplished in some prior tuners by firmly gripping (biasing) the tuning core against its associated tubular coil form, or support member, by members formed integral with the tubular coil form or support which contact and apply a pressure to the tuning core urging it against the internal surface of the tubular coil form or support. In other words, the coil form or support and core were constructed to provide a slidable friction press fit. This has not been altogether satisfactory from the standpoint that the friction loading forces acting on the tuning core in such tuners have resulted in requiring greater forces to provide the sliding axial operation necessary to accomplish tuning. Also, extremely close dimensional tolerances may be required in such friction fit prior tuners to prevent extremely high friction forces, and this adds to the expense of such prior tuners.

In the case of a pushbutton tuner in an automobile receiver, the mechanical driver forces necessary to overcome high friction forces acting on the tuning core can result in a malfunction to the pushbutton and/or the tuning operation. Further, with the advent of new and improved radio broadcast systems requiring very close tuning tolerances in the order of 250 cycles or less, the effect of vibrations on the tuning core may well give rise to undesirable microphonics in the receiver, and this means that the tuner must restrict all movement of the tuning core with respect to the coil to prevent detuning due to vibration. As a result there is a need for an inexpensive tuning apparatus which is easy to operate by pushbuttons but which minimizes the occurrence of microphonics in the associated receiver due to undesired relative axial and radial movement between the core and coil.

SUMMARY OF THE INVENTION

It is therefore a principal object of this invention to provide an improved tuning apparatus.

It is a further object of this invention to provide an improved tuning apparatus of the pushbutton type in automobiles in which a tuning core is axially moved during tuning relative to a tubular coil form around which an inductance coil is wound while preventing side-to-side (radial) movement of the core when tuning is not desired.

It is still a further object of the present invention to construct a tuning core apparatus of the pushbutton type in a simplified manner and to minimize the effect of vibrations which gives rise to microphonics in an associated receiver.

It is a further object of the present invention to provide an improved tuning apparatus for use in pushbutton radio receivers and the like wherein a tuning core may be permitted to freely and easily move relative to a tubular coil form in an axial direction but wherein side-to-side play between core and coil form is effectively eliminated.

The invention, generally speaking, provides a tuning core apparatus operable by pushbuttons to enable sliding movement during the tuning operation but which minimizes the effect of vibrations on the tuning core to resist side-to-side movement thereof during non-tuning periods thereby minimizing the effect of microphonics on an associated receiver. This is accomplished by providing an elongated spring member which is carried by the core inside a tubular coil form and radially biases the core against the coil form while permitting axial sliding movement between the core and coil in response to push-button actuation.

DETAILED DESCRIPTION OF THE PREFERRED EMBODIMENT

Figure 1:
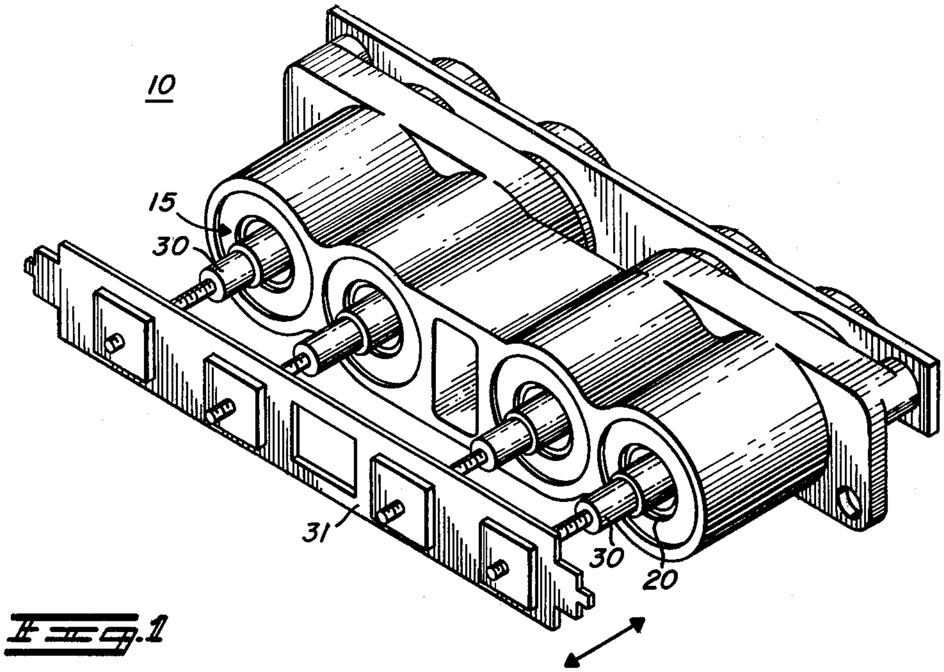
FIG. 1 is a front perspective view of an improved tuning core apparatus according to the present invention.
Figure 2:
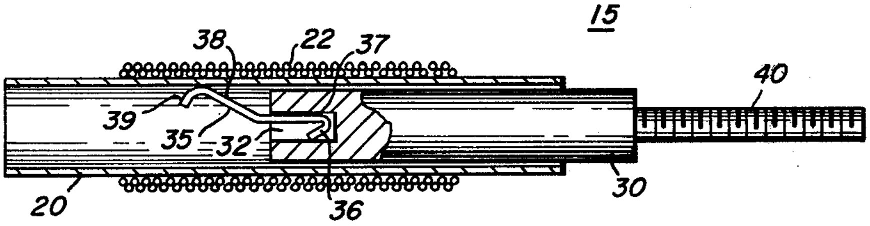
FIG. 2 is a side cross-sectional view of the tuning core apparatus.

Referring to FIGS. 1 and 2, there is shown a tuning core apparatus 10 of the pushbutton type generally used with automobile receivers. The apparatus 10 incorporates an improved tuning core assembly according to the invention. The tuning apparatus includes a plurality of tuning core assemblies 15 each of which has a tubular coil form member 20 around which is wound an inductance coil 22. Disposed within each coil form member 20 is a cylindrical tuning core or slug member 30 which is slidable along its longitudinal axis relative to coil 22 to effect the desired tuning operation. The longitudinal axis of the tuning core 30 substantially coincides with the longitudinal axis of the coil form member 20 and the longitudinal axis about which the coil 22 is wound. In automobile radio receivers, the tuning operation is effected by pushbuttons or a manual tuning knob (not shown) which move a core carriage 31 having drive shafts 40 connected to one end of each tuning core 30 whereby an axial movement is imparted to the tuning cores.

In accordance with the invention, the tuning core member 30 is formed with a channel 32 at one end thereof (preferably the end opposite to the end connected to the shaft 40) to receive an elongated flexible spring member 35 for a purpose to be described. Flexible member 35 is made of any suitable material and preferably is formed of fine music wire having a diameter ranging from about 0.005 to about 0.015 inches. The flexible member has one end with leg portions 36 and 37 forming an acute angle which are received inside channel 32 in a snug friction fit such that the spring member 35, after assembly, is integrally carried by and fixed to the tuning core 30 during axial movement of the core 30. At the other end of the flexible spring member 35 are leg portions 38 and 39 which are arranged at substantially a right angle to one another and abut against the interior surface of tubular coil form member 20 and compress the flexible member 35. By this structure, sufficient pressure is exerted by the flexible member 35 to resist lateral or side-to-side (radial with respect to the longitudinal axis of tuning core 30) movement of the tuning core 30 relative to coil 22 which could be caused by vibrations such as would occur in automobiles. It has been found that these vibrations undesirably cause microphonics in radio receivers which do not sufficiently restrict the lateral or axial movement of the tuning cores. Furthermore, the tuning core of the present invention is still easily axially slidable within tubular coil form member 20 to effect the desired tuning operation without unduely increasing the axial friction loading of the core.

It is contemplated that the outer diameter of the tuning core 30 is sufficiently less than the inner diameter of the tubular coil form 20 such that a friction fit is not provided between these members, therefore providing for less critical tolerances required for the manufacturing of these parts. It should be noted that the spring member 35 causes radial (lateral) biasing of the core 30 against the coil form 20 within the coil form itself thereby providing a stabilizing radial biasing force to the tuning core 30 at the area of the core which is most likely to cause tuning (frequency) shifts due to vibrations. Also the tuning core 30 is supported at both ends by shaft 40 and flexible member 35 adding to the stability of the tuning assembly.

Figure 3:
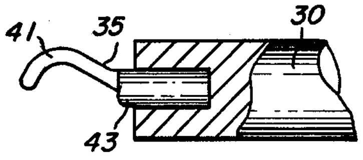
FIG. 3 is a side view illustrating a different embodiment of the flexible member of the tuning core apparatus.

FIG. 3 shows an alternative embodiment for flexible member 35 in which a molded plastic material is used instead of the fine music wire. Member 35 has an extending arcuate portion 41 to abut against the interior surface of tubular coil form member 20 to minimize the effect of vibrations which give rise to undesirable microphonics on an associated radio receiver. An end portion 43 is inserted into channel 32 of core member 30 to provide a snug fit. The plastic material is selected to provide the proper spring characteristic to achieve the result of preventing undesirable side-to-side movement of the tuning core member 30 during non-tuning periods.

While a specific embodiment of this invention has been shown and described, further modifications and improvements will occur to those skilled in the art. All modifications which retain the basic underlying principles disclosed and claimed herein are within the scope of this invention.

What is claimed is:

1. An improved vibration-resistant tuning core apparatus adaptable for use in radio receivers with pushbutton tuners, comprising in combination:

at least a single tubular coil form member having an inductance coil wound therearound, said coil form member having an interior surface forming an inner diameter of said coil form member, a cylindrical tuning core member, having a longitudinal axis, disposed within said coil form member and coil for axial sliding movement with respect thereto, said cylindrical tuning core member having an outer diameter sufficiently less than the inner diameter of said coil form member interior surface so as to prevent a sliding friction fit therebetween, a receiver tuning core carriage having a drive shaft fixed to and supporting a first longitudinal end of said tuning core member for providing said axial sliding movement of said tuning core member with respect to said coil form member, and an elongated flexible member having one end portion fixed to a second longitudinal end said tuning core member opposite said first longitudinal end, and an opposite end portion of said flexible member extending towards and abutting against the interior surface of said tubular coil form member to effect compression of said flexible member and provide a predetermined resistance to lateral (radial) movement of said tuning core member relative to said form member and coil thereby permitting axial sliding movement of said tuning core member relative to the coil form member and coil during the tuning operation while minimizing side-to-side movement of said tuning core member relative to the coil form member and coil at other times to minimize the effect of vibrations which give rise to undesirable microphonics, said flexible member also providing support to said tuning core member at said second longitudinal end of said tuning core member.

2. An improved vibration-resistant tuning core apparatus adaptable for use in radio receivers with pushbutton tuners, comprising in combination:

at least a single tubular coil form member having an inductance coil wound therearound, said coil form member having an interior surface forming an inner diameter of said coil form member, a cylindrical tuning core member disposed within said coil form member and coil and having a channel formed at one end thereof along the longitudinal axis thereof, said cylindrical tuning core member having an outer diameter sufficiently less than the inner diameter of said coil form member interior surface so as to prevent a sliding friction fit therebetween, a receiver tuning core carriage having a drive shaft fixed to and supporting a longitudinal end of said tuning core member opposite said end having said channel formed therein, said drive shaft providing for axial sliding movement of said tuning core member within and with respect to said coil form member, and an elongated flexible member having one end portion received in said channel in friction engagement therewith and an opposite end portion of said flexible member extending towards and abutting against the interior surface of said tubular coil form member to effect compression of said flexible member and provide a predetermined resistance to lateral (radial) movement of said tuning core member relative to said coil form member and coil thereby permitting sliding axial movement of the tuning core member relative to the coil form member and coil during the tuning operation while minimizing side-to-side movement of the tuning core member relative to the coil form member and coil at other times to minimize the effect of vibrations which give rise to undesirable microphonics, said flexible member also providing support to said tuning core member at said end of said tuning core member having said channel form therein.

3. Apparatus according to claim 2 wherein said elongated flexible member has said one end portion formed by leg elements defining an acute angle and the opposite end portion includes leg elements extending at substantially right angles.

4. Apparatus according to claim 3 wherein said flexible member is made of wire having a diameter ranging from about 0.005 to about 0.015 inches.

5. Apparatus according to claim 2 wherein said flexible member is made of a molded plastic material having one end portion which is received by said channel and an opposite end portion which has an arcuate shape abutting against the interior surface of the tubular coil form member.

6. Apparatus according to claim 2 wherein said elongated flexible member has said one end portion formed by leg elements defining an acute angle.

* * * * *